United States Patent [19]

Gazard et al.

[11] 4,195,108

[45] Mar. 25, 1980

[54] ELECTROLITHOGRAPHIC PROCESS WHICH MAKES IT POSSIBLE TO IMPROVE THE SENSITIVITY OF MASKING RESINS, AND A MASK OBTAINED BY THIS KIND OF PROCESS

[75] Inventors: Maryse Gazard; Jean-Claude Dubois, both of Paris, France

[73] Assignee: Thomson-CSF, Paris, France

[21] Appl. No.: 901,617

[22] Filed: May 1, 1978

[30] Foreign Application Priority Data

May 3, 1977 [FR] France .................................. 77 13344

[51] Int. Cl.$^2$ ................................................ B05D 3/06
[52] U.S. Cl. .................................... 428/195; 427/43.1; 430/5; 430/942; 430/323
[58] Field of Search ...................... 427/43, 44; 96/35.1; 428/195

[56] References Cited

U.S. PATENT DOCUMENTS

| | | | |
|---|---|---|---|
| 2,907,675 | 10/1959 | Gaylord | 427/44 |
| 2,956,899 | 10/1960 | Cline | 427/44 |
| 3,088,791 | 5/1963 | Cline et al. | 427/44 |
| 4,041,192 | 8/1977 | Heger et al. | 427/43 |

OTHER PUBLICATIONS

Fredericks, "IBM Tech. Disc. Bull.," vol. 21, #7, Dec. 1978, p. 2824.

*Primary Examiner*—John H. Newsome
*Attorney, Agent, or Firm*—Oblon, Fisher, Spivak, McClelland & Maier

[57] ABSTRACT

A process rendering certain electron masking resins more sensitive or rendering polymers which are unsufficiently sensitive to electrons suitable for industrial utilization, in particular for application to electron masking, a method which employs scanning with a very fine electron beam controlled by the computer. The process involves electron irradiation at low dose levels, sufficient however to create free radicals, followed by diffusion of an appropriate copolymerizing monomer by grafting to the initial polymeric chain opened by the irradiation process. The solubility of the copolymer vis-a-vis certain solvents is selective, enabling the masks to be developed.

7 Claims, No Drawings

ELECTROLITHOGRAPHIC PROCESS WHICH MAKES IT POSSIBLE TO IMPROVE THE SENSITIVITY OF MASKING RESINS, AND A MASK OBTAINED BY THIS KIND OF PROCESS

The present invention relates to an electron lithographic process which makes it possible to improve the sensitivity of masking resins of the kind used in particular to form masks employed in the manufacture of semiconductor devices.

A masking resin is a polymer used for the chemical etching of a substrate (for example semiconductor material covered with a silica layer). The mask is produced by causing the polymer to undergo structural modifications by the use of radiation; these modifications can be of two kinds:

the first kind (positive resin): the polymer degrades, its molecular weight decreases and its solubility increases.

the second kind (negative resin): the polymer cross-links, its molecular weight increases and it becomes insoluble.

The mask is obtained by selectively dissolving the irradiated parts (positive resin) or non-irradiated parts (negative resin), with the help of developers selected as a function of the polymer used.

The production of a mask with the help of positive or negative resins, therefore comprises the following stages:

deposition of the resin in the form of a thin film (thickness generally less than 1 micron) upon the substrate which is to be etched; this disposition is generally formed by centrifuging of a solution of the polymer in a conventional solvent;

stove-drying in order to eliminate the solvent and increase the adhesion of the film to the substrate;

irradiation in accordance with a predetermined pattern during a time corresponding to the dose required in order to degrade or cross-link the polymer (depending upon the type of resin);

developing with the help of a solvent acting selectively upon those areas having the lowest molecular weight.

The mask thus obtained is then ready for operations of etching or doping.

A masking resin must possess the following properties:

(a) it should be easy to use, that is to say it should be suitable for the formaton of thin, uniform film adhering firmly to the substrate;

(b) it should have high resistance to the chemical agents used to etch the substrate after the developing of the mask;

(c) it should be sensitive vis-a-vis the radiation, the sensitivity being defined as the minimum irradiation dose (quantity of electricity in coulombs in the case of electrons) required to render the polymer soluble or insoluble in the developing solvent.

Two types of irradiation can be employed in practice: irradiation with ultraviolet light in the case of so-called "photosensitive" resins; and electron irradiation in the case of "electron sensitive" resins.

It has been shown that this latter kind of irradiation, using an electron beam in a vacuum, makes it possible to form mask patterns which have better resolution than is the case with conventional photolithography. However, for electron irradiation to be of any industrial significance, it is necessary for the polymers to be capable of being irradiated efficiently at small dose levels, that is to say in practice, during a very short time interval when considering an electron beam of normal intensity. A resin cannot be utilised industrially in particular in the case of irradiation by electron scanning, unless its sensitivity corresponds to a dose not in excess of $5 \times 10^{-6}$ coulombs per $cm^2$, considering electrons of 20 keV energy.

Those resins which are most sensitive to electrons, are of the negative type: sensitivities of $10^{-6}$ coulombs per $cm^2$ are observed in the case of polymers of the epoxy type.

The best known positive resin is poly(methylmethacrylate). This polymer has all the requisite properties to make it suitable for use as a masking resin, but on the other hand exhibits low sensitivity to electrons, its sensitivity being around $5 \times 10^{-5}$ coulombs per $cm^2$.

The invention makes it possible to improve the sensitivity of certain resins.

According to the invention, there is provided an electron lithographic process which makes it possible to improve the sensitivity of masking resins, comprising a step during which there is caused to act upon the polymer constituting said resin, a monomer capable of attaching itself by grafting to said polymer in order to form a copolymer whose properties vis-a-vis agents which develop the mask, are different, said step being preceded by electron irradiation corresponding to a much lower dose than that which would be required to produce the mask, wherein said dose is sufficient, however, to create free radicals in the irradiated parts of the polymer.

The invention will be better understood and other of its features rendered apparent from a consideration of the description and the following examples.

The polymer chosen to form the mask is either of the conventional kind used for electron masking or of a kind which is not used industrially due to its low sensitivity (polymethacrylate, polyester, polysiloxane, cellulose or a derivative of cellulose). The steps of the process are similar to those of conventional masking except insofar as the supplementary step of copolymerisation intervening after the electron irradiation, is concerned:

(a) deposition of the resin on the substrate which is to be etched; this deposition is generally performed by centrifuging, the substrate being placed upon a mounting rotating at high speed, upon which a small quantity of a solution of the polymer in a conventional solvent is placed.

(b) stove-drying in order to eliminate the solvent by maintaining the substrate at a temperature ranging between 50° and 200° C. in a normal atmosphere, for a period varying from some few minutes to an hour depending upon the nature of the solvent and the polymer.

(c) irradiation with electrons having energies comprised between 5 and 30 keV for a period determined by previous experimentation.

(d) copolymerisation : a monomer capable of attaching itself by grafting to the initial polymer, for example acrylic acid, acrylonitrile, divinylbenzene, ethylene glycol diacrylate, is introduced by diffusion. To this end, the substrate is placed in a solution of the monomer and the system held in an enclosure for a period of one day or more, at a temperature of the order of 60° C. and a pressure as low as possible taking account of the presence of the saturating vapour.

(e) developing: the substrate is immersed in a solvent capable of selectively dissolving either the initial polymer or the copolymer which results from the process carried out in the preceding step.

(f) heat treatment; this treatment has the effect of increasing the cohesion in the material of the mask and possibly also of improving its adhesion to the substrate.

One possible explanation of the above copolymerisation is as follows: during the irradiation step, the electrons, on passing through the molecular chains of the initial polymer, create reactive sites where free radicals are present. During the next step, the free radicals enable monomeric chains to graft onto the polymeric chains, thus forming a copolymer of the "grafted" kind. The chemical function of the grafted monomer is chosen as a function of the desired effect, that is to say the solubility or insolubility of the copolymer formed in a given solvent. For example, the acid function of the monomer (acrylic acid for example) can render the copolymer soluble in alcohols whereas the polymer would have been insoluble in such solvents. The grafting on of acrylonitrile to poly(methylmethacrylate) in particular renders this polymer insoluble in ketones.

In the example described hereinafter, the initial polymer is poly(methylmethacrylate) whose sensitivity as a masking resin for electronic processes, is of about $5 \times 10^{-5}$ coulombs per cm$^2$ (it is therefore practically useless in the case of irradiation by scanning with an electron beam). The grafting monomer is acrylic acid. The copolymer which results is soluble in methanol where poly(methylmethacrylate) itself would be insoluble.

The process is as follows:

In step (a), using centrifuging there is deposited upon the substrate to be processed, a small quantity of a solution of poly(methylmethacrylate) (10%) in methylisobutylketone. Depending upon the speed of rotation of the substrate, a layer having a thickness of 0.2 to 0.5 microns results.

In step (b), drying is performed at 170° C. for a period of 30 minutes.

In step (c) irradiation is performed using an electron beam of 20 keV for a period calculated to produce a charge density ranging between $1 \times 10^{-7}$ and $1 \times 10^{-\neq}$ coulombs per cm$^2$. This time depends upon the total intensity of the beam, and upon the total area to be irradiated.

In step (d), a 15% solution in distilled water of high-purity acrylic acid (possibly purified by distillation), is formed. The substrate is placed in the solution and maintained at 60° C. for 24 hours in an enclosure from which air has been removed by a prior pumping operation, the remaning volume above the liquid being occupied solely by water and acid vapours. The substrate is then rinsed in deionized water.

In step (e), the non-irradiated parts are dissolved by applying methanol to the substrate in order to create the desired mask.

It will be seen that the invention makes it possible to obtain the equivalent of an improvement in sensitivity by 50 to 500 times for a current masking resin such as poly (methylmethacrylate).

What we claim is:

1. An electron lithographic process which makes it possible to improve the sensitivity of masking resins, comprising:
    (a) deposition upon a substrate which is to be etched, of a solution of said polymer in a solvent, this in such a manner as to produce a layer of uniform thickness;
    (b) drying in order to eliminate the solvent;
    (c) irradiation of the polymer by electrons having a given energy;
    (d) copolymerisation by the grafting of a monomer to the initial polymer, said copolymerisation only taking place in the irradiated areas;
    (e) developing of the mask by an agent which selectively dissolves the initial or grafted parts of the polymer;
    (f) heat treatment of the substrate covered by the mask.

2. A process as claimed in claim 1, wherein said polymer belongs to the group of substances listed hereinafter; poly(methylmethacrylate), polyester, polysiloxane, and cellulose.

3. A process as claimed in claim 1, wherein said layer has a thickness of 0.2 of 0.5 microns; and the electrons have an energy of 5 to 30 keV.

4. A process as claimed in claim 2, wherein said monomer belongs to the group of substances listed hereinafter: acrylic acid, acrylonitrile, divinylbenzene, ethylene glycal diacrylite.

5. A process as claimed in claim 1, wherein said polymer is poly(methymethacrylate); said drying takes place at 170° C. for 30 minutes; said irradiation takes place using electrons having an energy of 20 keV; the irradiation dose is of the order of $10^{-6}$ to $10^{-7}$ coulombs per cm$^2$; said monomer is acrylic acid; and the developing agent is methanol.

6. A process as claimed in claim 5, wherein the copolymerisation is performed by preparing a 15% solution of acrylic acid in distilled water, by immersing the irradiated polymer in said solution and by maintaining the system at 60° C. for 24 hours after previously pumping off the air above the solution.

7. A mask obtained by the process claimed in claim 1.

* * * * *